United States Patent
Chang et al.

(10) Patent No.: US 7,545,847 B2
(45) Date of Patent: Jun. 9, 2009

(54) FREQUENCY SYNTHESIZER APPLIED TO FREQUENCY HOPPING SYSTEM

(75) Inventors: Chi-Tung Chang, Taipei (TW); Chih-Hao Lai, Taipei (TW); Chieh-Tsao Hwang, Taipei (TW)

(73) Assignee: Alcor Micro, Corp., Nangang District, Taipei (TW)

( * ) Notice: Subject to any disclaimer, the term of this patent is extended or adjusted under 35 U.S.C. 154(b) by 95 days.

(21) Appl. No.: 11/773,963

(22) Filed: Jul. 6, 2007

(65) Prior Publication Data

US 2008/0285625 A1 Nov. 20, 2008

(30) Foreign Application Priority Data

May 14, 2007 (TW) .............................. 96117102 A

(51) Int. Cl.
*H04B 1/38* (2006.01)
(52) U.S. Cl. .............................. 375/133; 331/4; 375/260
(58) Field of Classification Search ...................... 331/4; 375/133, 260
See application file for complete search history.

(56) References Cited

U.S. PATENT DOCUMENTS 7,012,471 B2 * 3/2006 Lyden et al. ................... 331/16
7,352,251 B2 * 4/2008 Krishnan et al. .............. 331/16
7,499,684 B2 * 3/2009 Cavin .......................... 455/141

* cited by examiner

*Primary Examiner*—Felisa C Hiteshew
(74) *Attorney, Agent, or Firm*—Winston Hsu

(57) ABSTRACT

A frequency synthesizer applied to a frequency hopping system includes a voltage controlled oscillator (VCO), a phase lock loop (PLL) system, a second frequency divider, a first SSB mixer, a second SSB mixer, and a multiplexer. The VCO generates an oscillating frequency. The PLL system includes a first frequency divider and divides the oscillating frequency by 10 to generate a first dividing signal. The second frequency divider divides the oscillating frequency by 2 to generate a second dividing signal and further divides the second dividing signal by 2 to generate a third dividing signal. The first SSB mixer mixes frequencies of the second and third dividing signals to generate a first mixing signal. The second SSB mixer mixes frequencies of the first mixing signal and the first dividing signal to generate a second mixing signal. The Multiplexer determines to output the first mixing signal or the second mixing signal.

19 Claims, 6 Drawing Sheets

FREQUENCY SYNTHESIZER APPLIED TO FREQUENCY HOPPING SYSTEM

BACKGROUND OF THE INVENTION

1. Field of the Invention

The present invention relates to a frequency synthesizer, and more particularly to a frequency synthesizer applied to frequency hopping system.

2. Description of the Prior Art

Transceivers in a wireless communications system utilize frequency synthesizers to generate carrier frequencies (central frequencies) of different frequency bands for wireless signal transmission and reception. Regarding the new generation of the ultra-wide-band (UWB) communications system, the system combines multi-band orthogonal frequency-division multiplexing (multi-band OFDM) and frequency hopping technologies. According to corresponding protocol specifications, such as IEEE 802.15.3a, UWB system includes five band groups, where a first band group has three bands. Each band has a bandwidth of 528 MHz and corresponding central frequencies are 3432 MHz, 3960 MHz and 4488 MHz. Multi-band OFDM adopts time-frequency interleaving to transmit and receive OFDM symbols, indicating that the UWB system alternately operates in one of the bands when each time a symbol is transmitted or received. According to the specifications, Each OFDM symbol length is 312.5 nano-seconds (ns), and a frequency hopping from band to band is smaller than 9.5 ns. Therefore, a frequency synthesizer applied to the UWB system must cover the bands with respect to the carrier frequencies and can finish a frequency hopping in 9.5 ns.

In typical frequency synthesizer design, the PLL transition time of switching one band to another depends on the PLL bandwidth. If the PLL band switching time is considered to be less than 9.5 ns, the PLL bandwidth is necessarily more than 100 MHz. In addition, for a typical stable PLL design, a reference frequency in the PLL has to be 10 times or more the PLL bandwidth. With the above-mentioned restrictions, the typical frequency synthesizer needs to use the reference frequency of over 1 GHz for the UWB specifications, resulting in high power consumption, high cost and unpractical design.

To deal with the PLL-transition-time issue, many development and research institutions publish various solutions. For example, ISSCC (International Solid State Circuits Conference) 2005 Sec 11.9 p. 216-218 discloses a frequency synthesizer employing three independent PLL circuits and VCOs to generate the foregoing carrier frequencies at 3432 MHz, 3960 MHz and 4488 MHz. Under the architecture, the frequency synthesizer eliminates waiting for the PLL transition time. However, it costs triple current consumption and chip area to use three independent PLL circuits simultaneously.

JSSC (IEEE Journal of Solid-State Circuits) 2005 Aug. p. 1671-1679 discloses a frequency synthesizer employing two independent PLLs and a multiplexer. The multiplexer is used for selecting a carrier frequency from one of the PLLs to output. While one PLL is ready to transceiver data, the other switches and settle its frequency and the multiplexer changes selection output every symbol period (312.5 ns). The operation is considered a pipeline operation allowing each PLL transition time to become 312.5 ns instead of 9.5 ns. However, pipeline operation of two PPLs stills consumes double power and area. Besides, each PLL and VCO thereof must cover three bands, increasing design complexity.

The simplest PLL architecture employs one PLL, one VCO, and a Single-Side-Band Mixer (SSB Mixer). Please refer to FIG. 1, which is a schematic diagram of a frequency synthesizer 10 according to the prior art. The frequency synthesizer 10 can generate the above-mentioned carrier frequencies of the bands and includes a VCO 11, a PLL circuit 12, a frequency divider 14, a SSB mixer 16 and a multiplexer 18. The VCO 11 and the PLL circuit 12 are used to generate an in-phase signal and a quadrature signal both having a frequency f1 at 3960 MHz. The in-phase signal and the quadrature signal are called I/Q signal hereinafter for brevity. The frequency divider 14 divides the frequency f1 by 7.5 to generate I/Q signals with frequency f2 at 528 MHz. The SSB mixer 16 multiplies frequencies f1 and f2 and generates two down-converted/up-converted frequencies at 3432 MHz and 4488 MHz, respectively. In addition, the SSB mixer 16 determines one of the generated frequencies of 3432 MHz and 4488 MHz to output as a frequency f3 according to a control signal SC1. The multiplexer 18 selects the output frequency f1 or the frequency f3 to output according to a control signal SC2. Although this architecture is very simple, uses only one VCO and one PLL; however, the dividing number of the frequency divider 14 is 7.5, not an even integer. This increases difficulty for the frequency divider 14 to generate the I/Q signal with phase difference of exactly 90 degrees, implying a need of a poly-phase filter to generate I/Q signals.

In addition, image-signal suppression ability is a main consideration for selection of SSB mixers. Strong image signal component may cause severe spur noise in transmitters and a low signal-to-noise ratio (SNR) in receivers. That is, the more ideal characteristic (identical signal amplitude and exactly 90-degree phase difference) the I/Q signal inputted to the SSB mixer has, the better image signal suppression the SSB mixer could achieve. This is well known in the art and the explanation thereof is omitted. However, it is difficult for the SSB mixer to have an ideal I/Q signal input when high-frequency applications, and an extra narrowband filter is demanded to filter out the image signal. A Q index is used to determine filter design difficulty, where the Q index is defined as a value of a desired signal after signal mixing over frequency difference of the desired signal and the image signal. For the SSB mixer 16 in FIG. 1, the Q index is obtained by an equation: $(f1+f2) \div (2 \times f2) = 4.25$. The higher Q index indicates that the SSB mixer requires a high Q-factor narrowband filter to filter out the image signal. As is well known in the art, the narrowband filter having a high Q factor has better filtering ability but the design complexity is high. Therefore, how to design a frequency synthesizer with a demanded low Q index filter is also a main object.

Please refer to FIG. 2, which is a schematic diagram of a frequency synthesizer 20 according to the prior art. The frequency synthesizer 20 includes a VCO 200, a PLL circuit 210, frequency dividers 220 and 230, a multiplexer 240 and SSB mixers 250 and 260. In FIG. 2, the oscillating frequency of the VCO is 4.224 GHz and the frequencies inputted to the mixer 250 are 528 MHz and 264 MHz. As a result, the Q index of the mixer 250 is obtained by $(528+264) \div (2 \times 264) = 1.5$. As for the mixer 260, the input frequencies are 4224 MHz and 264 MHz, and thereby the Q index is obtained by $(4224+264)/(2 \times 264) = 8$. The Q index of the mixer 260 is so high that the narrowband filter is difficult to be implemented. Besides, the VCO 200 requires a poly phase filter (PPF) to generate I/Q signals.

To improve the high Q-index problem, US Application no. 2006/0183455A1 discloses a frequency synthesizer including a VCO, a plurality of frequency dividers, a PPF, a PLL circuit and a mixer. The VCO generates a frequency at 7920 MHz, and divides to the frequency divider generates frequencies at 3960 MHz and 528 MHz. The PPF is responsible for transforming the signal at a frequency of 528 MHz into I/Q signals, and the mixer then generates the desired carrier frequencies. In the architecture, the Q index of the mixer is 4, applicable for design. However, the frequency synthesizer requires the PPF for I/Q signal and the VCO to operate at 8 GHz.

As above, the primary objective is to design a frequency hopping synthesizer architecture with low complexity, low power consumption and small area occupation.

SUMMARY OF THE INVENTION

It is therefore a primary objective of the present invention to provide a frequency synthesizer that has high integration, low complexity, low power consumption and small area and is applied to a frequency hopping system.

The present invention discloses a frequency synthesizer applied to a frequency hopping system. The frequency synthesizer includes a voltage controlled oscillator (VCO), a phase lock loop (PLL) system, a second frequency divider, a first single-side-band mixer (SSB mixer), a second SSB mixer and a multiplexer. The VCO is used for generating 5.28 GHz according to a voltage control signal. The PLL system includes a first frequency divider which divides the oscillating frequency by 10 and generates a first dividing signal. PLL also locks the voltage control signal according to the first dividing signal frequency and reference signal frequency. The second frequency divider connects to the VCO and used for dividing the oscillating frequency by 2 to generate a second dividing signal and a third dividing signal. The first SSB mixer connects to the second frequency divider and used for mixing the second dividing signal and the third dividing signal to generate a first mixing signal. The second SSB mixer connects to the PLL system and the first SSB mixer and is used for mixing the first mixing signal and the first dividing signal to generate a second mixing signal according to a first band selection signal. The multiplexer connects to the first SSB mixer and the second SSB mixer and is used for selecting the first mixing signal or the second mixing signal to output according to a second band selection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
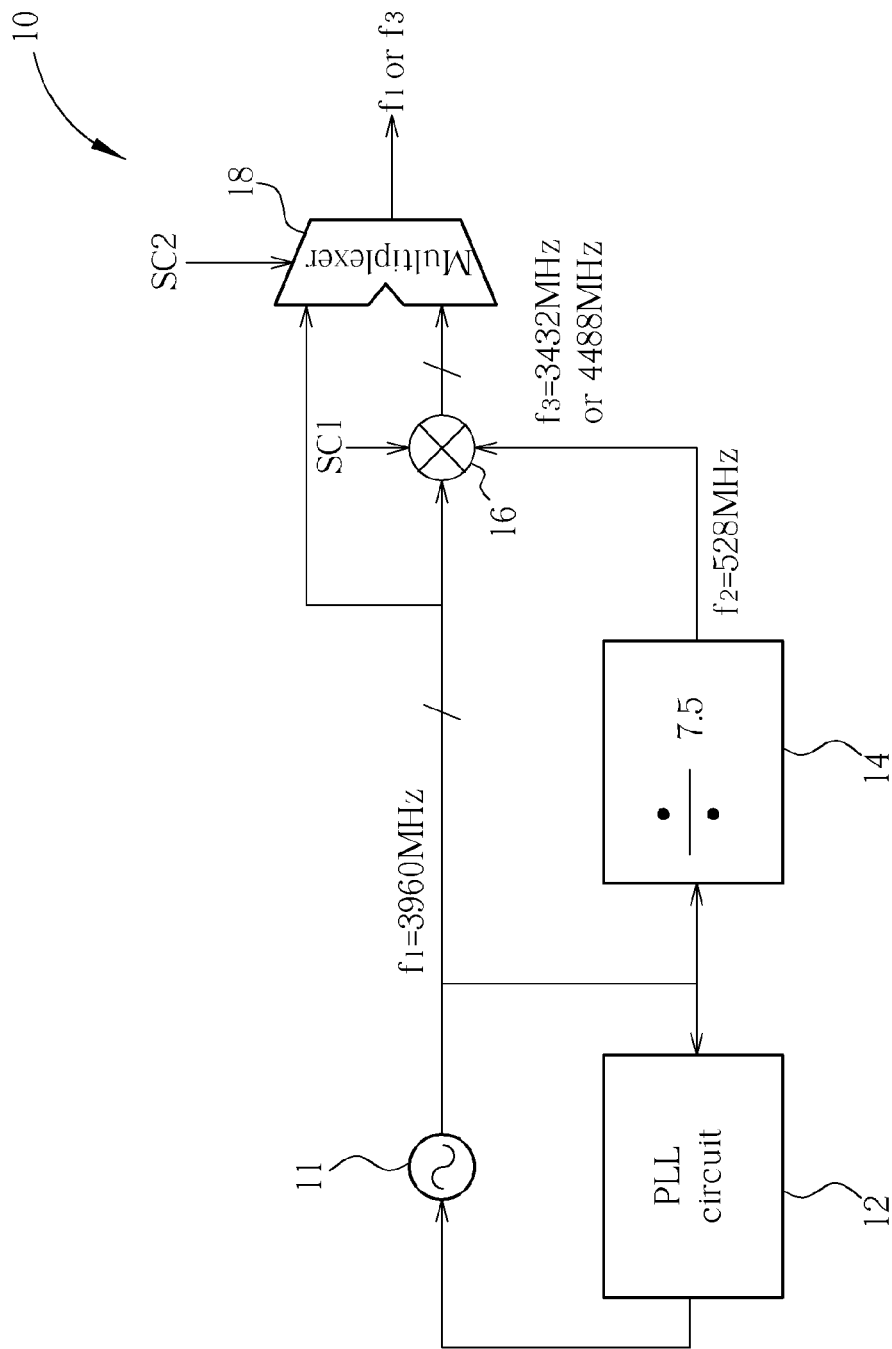
FIG. 1 is a schematic diagram of a frequency synthesizer according to the prior art.
Figure 2:
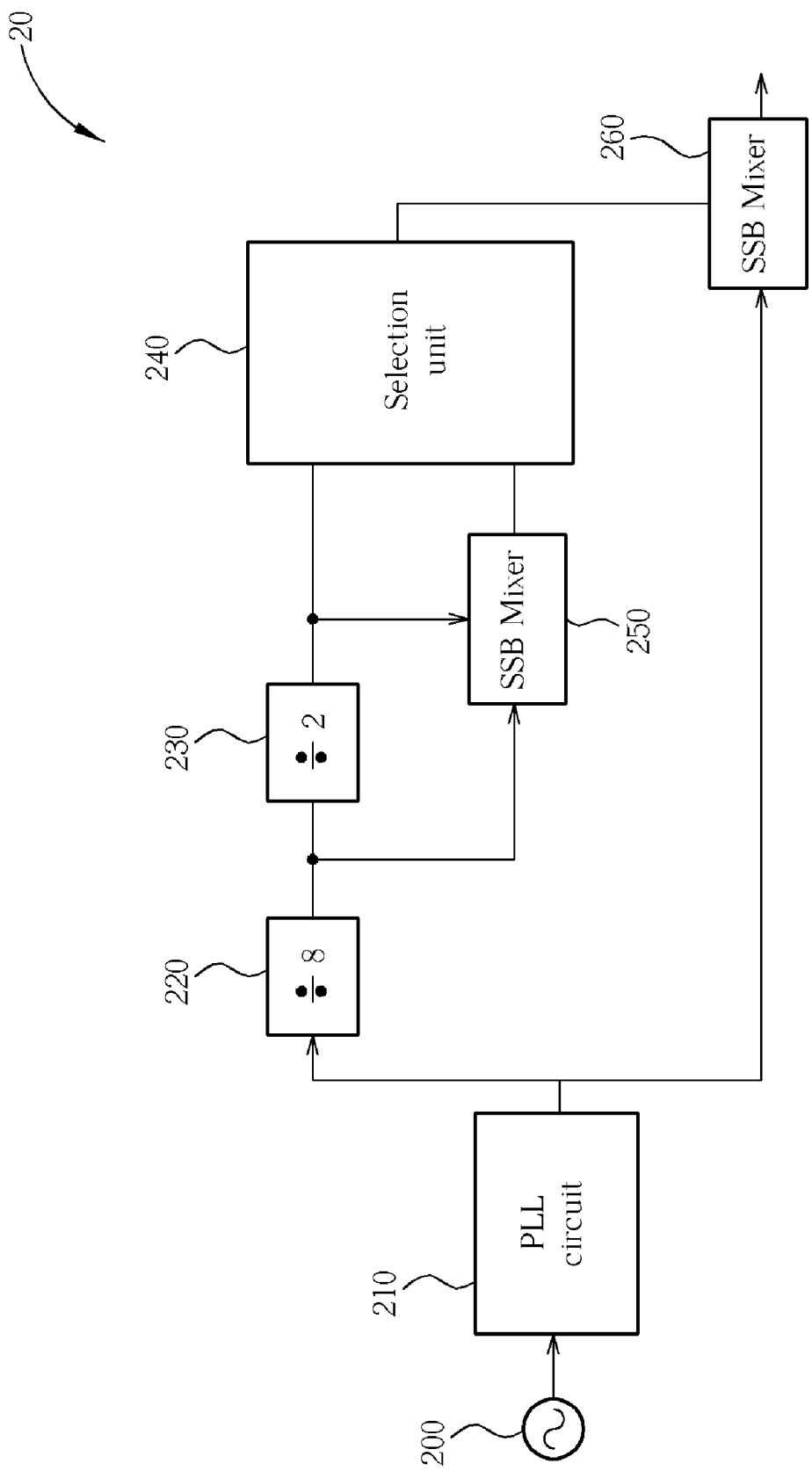
FIG. 2 is a schematic diagram of a frequency synthesizer according to the prior art.
Figure 3:
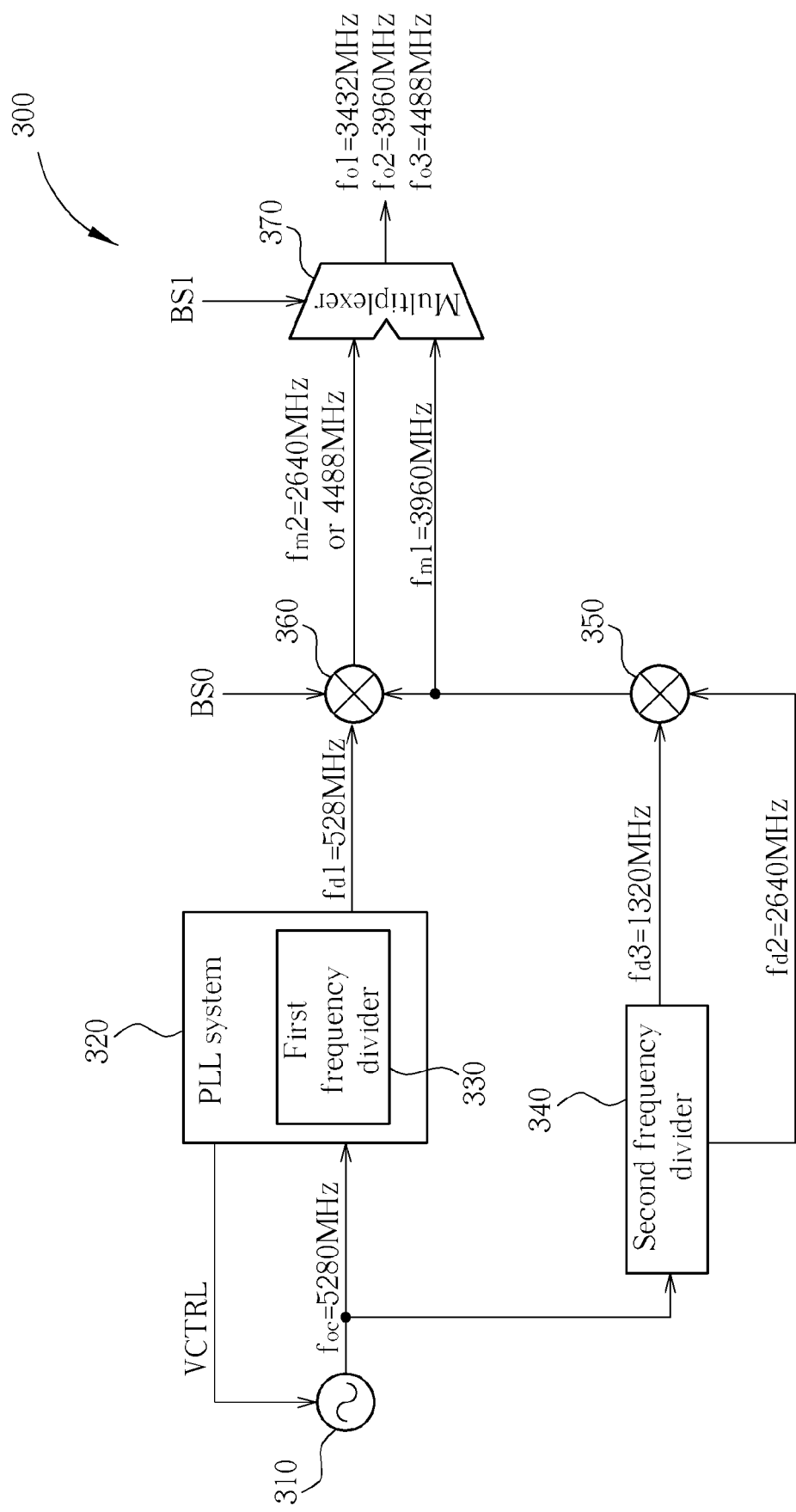
FIG. 3 is a schematic diagram of a frequency synthesizer according to an embodiment of the present invention.

Please refer to FIG. 3, which is a schematic diagram of a frequency synthesizer 300 according to an embodiment of the present invention. For explaining the present invention conveniently, the frequency synthesizer 300 is applied to the first band group of the UWB system mentioned above and thereby functions to generate carrier frequencies of the three bands at 3432 MHz, 3960 MHz and 4488 MHz. The frequency synthesizer 300 includes a voltage controlled oscillator (VCO) 310, a phase lock loop (PLL) system 320, a second frequency divider 340, a first SSB mixer 350 and a second SSB mixer 360. The VCO 310 is used for generating an oscillating frequency foc of 5280 MHz according to a voltage control signal VCTRL. The PLL system 320 includes a first frequency divider 330 and is used for dividing the oscillating frequency foc by 10 with the first frequency divider 330 to generate a first dividing signal fd1. The PLL system 320 further divides frequency of the first dividing signal fd1 and thereby compares the divided frequency and an internal reference frequency to generate the voltage control signal VCTRL. The oscillating frequency foc generated by the VCO 310 can be stably locked at 5280 MHz with the voltage control signal VCTRL. The second frequency divider 340 connects to the VCO 310 and is used for dividing the oscillating frequency foc by 2 and 4 to generate a second dividing signal fd2 and a third dividing signal fd3, respectively. The first dividing signal fd1, the second dividing signal fd2 and the third dividing signal fd3 all include an in-phase and a quadrature signal (I/Q signal) and the three I/Q signals have frequencies of 528 MHz, 2640 MHz and 1320 MHz, respectively.

In the embodiment of the present invention, even-number frequency division allows the first frequency divider 330 and the second frequency divider 340 to generate I/Q signals easily. The first SSB mixer 350 connects to the second frequency divider 340 and is used for mixing the second dividing signal fd2 and the third dividing signal fd3 to generate a first mixing signal fm1 having a frequency of 3960 MHz. The second SSB mixer 360 connects to the PLL system 320 and the first SSB mixer 350 and is used for mixing the first mixing signal fm1 and the first dividing signal fd1 to generate a second mixing signal fm2 according to a first band selection signal BS0. Preferably, the second SSB mixer 360 adds or subtracts frequencies of the first mixing signal fm1 and the first dividing signal fd1 to generate a frequency of the second mixing signal fm2 at 4488 or 3432 MHz. The multiplexer 370 is used for selecting the first mixing signal fm1 or the second mixing signal fm2 to output according to a second band selection signal BS1. As can be known from the above, the frequency synthesizer 300 can output output-frequencies fo1, fo2 and fo3 at 3432 MHz, 3960 MHz and 4488 MHz as well as carrier frequencies of the bands of the first band group. For example, if the frequency synthesizer 300 is determined to output the output frequency fo1 (3432 MHz), the first band selection signal BS0 controls the second SSB mixer 360 to subtract the frequencies of the first mixing signal fm1 and the first dividing signal fd1. The multiplexer then selects the second mixing signal fm2 to output according to the second band selection signal BS1. As for the first SSB mixer 350 and the second SSB mixer 360, the operation principle of frequency addition or subtraction is well known in the art and will not be described in details.

Figure 4:
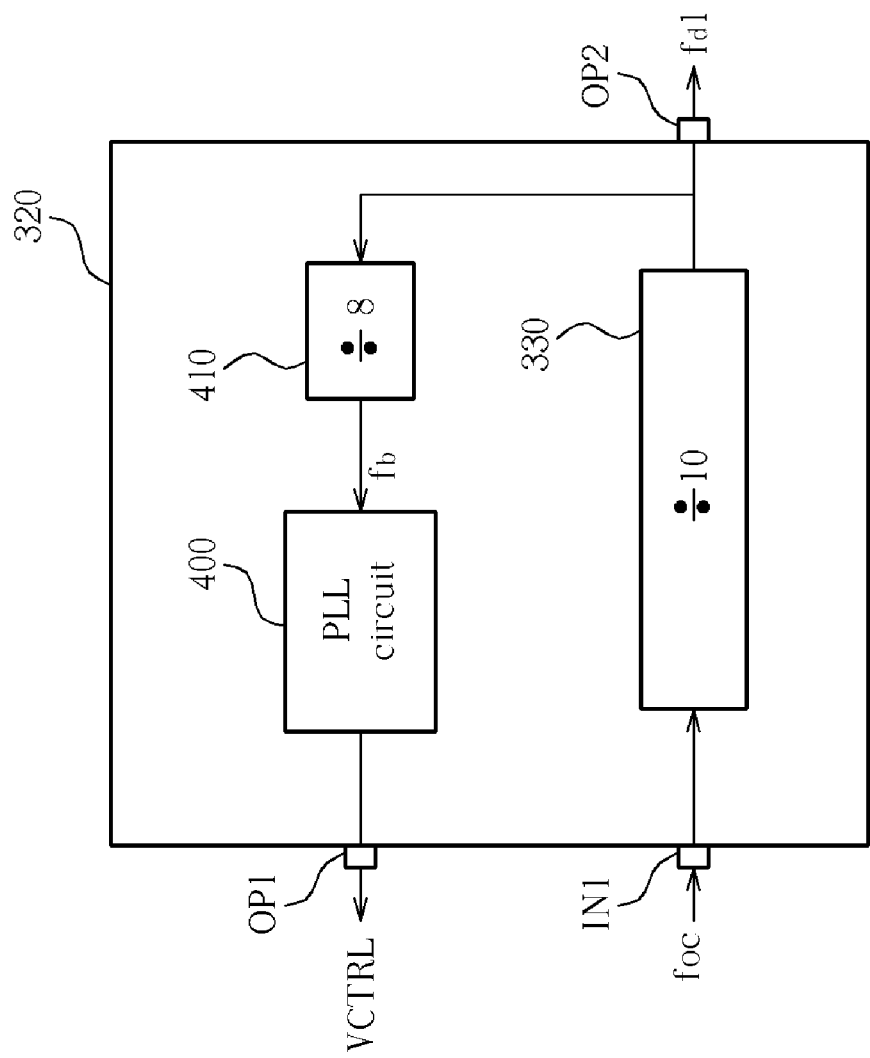
FIG. 4 is a schematic diagram of the PLL system of the frequency synthesizer in FIG. 3 according to an embodiment of the present invention.

Please refer to FIG. 4, which is a schematic diagram of the PLL system 320 in FIG. 3 according to an embodiment of the present invention. The PLL system 320 includes an output end OP1, an output end OP2, an input end IN1, a PLL circuit 400, the first frequency divider 330 and a third frequency divider 410. The output end OP1 outputs the voltage control signal VCTRL to the VCO 310. The output end OP2 outputs the first dividing signal fd1 to the second SSB mixer 360. The input end IN1 receives the oscillating frequency foc from the VCO 310. The third frequency divider 410 divides the frequency of the first dividing signal fd1 by 8 to generate a feedback frequency fb. The PLL circuit 400 is used for generating the voltage control signal VCTRL according to the feedback frequency fb and an internal reference frequency fref to stabilize the operating frequency of the VCO 310 to lock at 5280 MHz. The reference frequency fref is generated by the crystal oscillator built in the PLL circuit 400, and is set to be 66 MHz in the embodiment. In practice, the PLL circuit 400 compares phase/frequency of the feedback frequency fb and a reference frequency fref to generate the voltage control signal VCTRL to control VCO 310, and the detailed operation is well known in the art.

Figure 5:
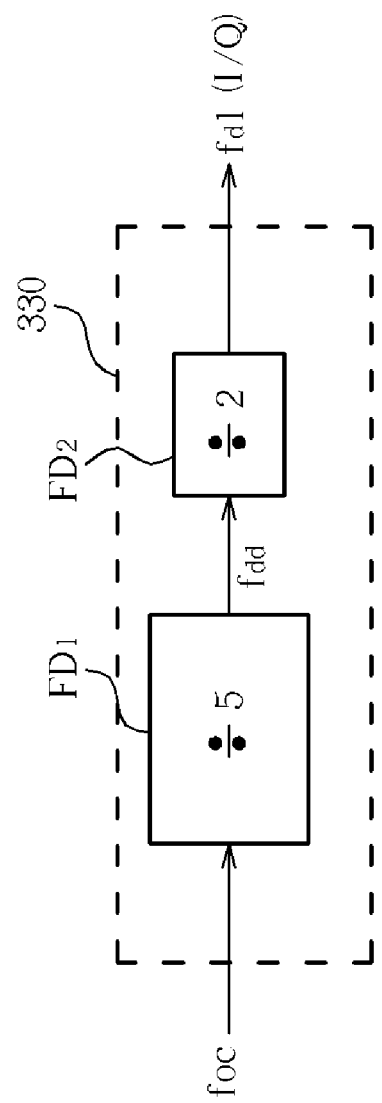
FIG. 5 is a schematic diagram of the first frequency divider of the frequency synthesizer in FIG. 3 according to an embodiment of the present invention.
Figure 6:
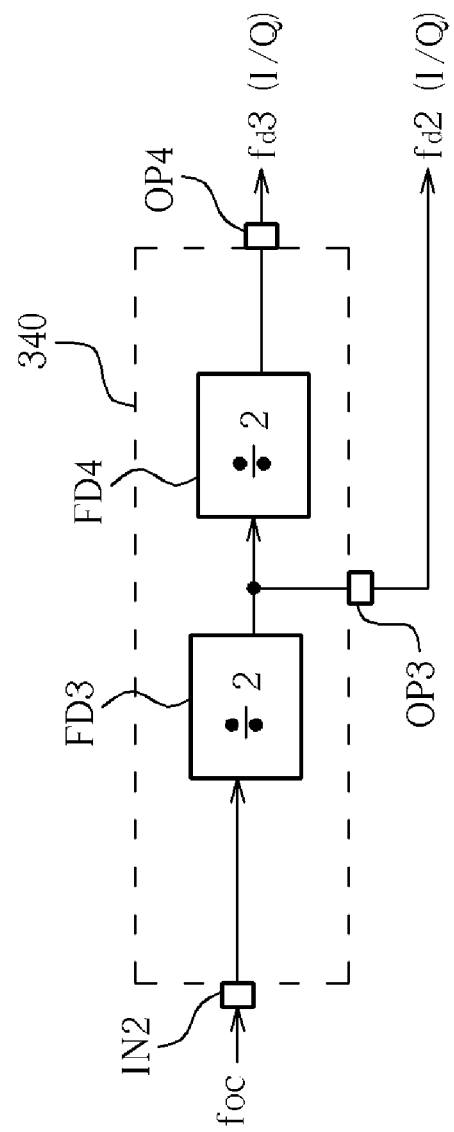
FIG. 6 is a schematic diagram of the second frequency divider of the frequency synthesizer in FIG. 3 according to an embodiment of the present invention.

Please refer to FIG. 5, which is a schematic diagram of the first frequency divider 330 of the PLL system 320 according to embodiment of the present invention. The first frequency divider 330 is used for dividing the oscillating frequency foc by 10, and includes frequency dividing units FD1 and FD2. The frequency dividing unit FD1 divides the oscillating frequency foc by 5 to generate a frequency fdd, and the frequency dividing unit FD2 divides the frequency fdd by 2 to generate the first dividing signal fd1 having I/Q signals at 528 MHz. Please continue by referring to FIG. 6, which is a schematic diagram of the second frequency divider 340 in FIG. 3 according to embodiment of the present invention. The second frequency divider 340 includes an input end IN2, output ends OP3 and OP4, and frequency dividing units FD3 and FD4. The input end IN2 receives the oscillating frequency foc from the VCO 310. The output ends OP3 and OP4 output the second dividing signal fd2 and the third dividing signal fd3 to the first SSB mixer 350, respectively. The frequency dividing unit FD3 is used for dividing the oscillating frequency foc by 2 to generate the second dividing signal fd2 having I/Q signals at 2640 MHz. Furthermore, the frequency dividing unit FD4 divides the second dividing signal fd2 by 2 to generate the third dividing signal fd3 having I/Q signals at 1320 MHz.

According the mentioned above, the Q index of the first SSB mixer 350 can be calculated by $(2640+1320) \div (2 \times 1320) = 1.5$, and the Q index of the second SSB mixer 360 is found by $(3960+528) \div (2 \times 528) = 4$. Thus, the frequency synthesizer 300 can employ a low Q-factor narrowband filter to filter out image signal, reducing design complexity. Besides, the frequency synthesizer 300 has no need of a poly-phase filter (PPF) to generate I/Q signals, which is achieved by even-number frequency division of the first frequency divider 330 and the second frequency divider 340. Moreover, even-number frequency division allows the first frequency divider 330 and the second frequency divider 340 to be implemented in simple architecture for generating I/Q signal of duty cycle 50% and phase difference of 90 degree.

Please note that the number of frequency dividers and related dividing numbers can be modified for the first frequency divider 330 and the second frequency divider 340 according to different applied applications. The operating frequency of the VCO 310, the number of the frequency dividers and related dividing numbers in the embodiment of the present invention is designed for the first band group of the UWB system.

In summary, the frequency synthesizer of the present invention adopts an architecture of one VCO, one PLL circuit and two SSB mixers. A single VCO and single PLL circuit consumes power properly. Besides, the SSB mixer only demands a simple narrowband filter by arranging the frequency dividers and related dividing numbers appropriately, reducing circuit complexity. Therefore, the frequency synthesizer of the present invention has advantages of high integration, low complexity, low power consumption and small area.

Those skilled in the art will readily observe that numerous modifications and alterations of the device and method may be made while retaining the teachings of the invention.

What is claimed is:

1. A frequency synthesizer applied to a frequency hopping system comprising:
   a voltage controlled oscillator (VCO) for generating an oscillating frequency according to a voltage control signal;
   a phase lock loop system comprising a first frequency divider, the phase lock loop system being used for dividing the oscillating frequency by a first even number with the first frequency divider to generate a first dividing signal and generating the voltage control signal according to the first dividing signal;
   a second frequency divider connecting to the VCO, for dividing the oscillating frequency by a second even number to generate a second dividing signal and a third dividing signal;
   a first single-side-band mixer (SSB mixer) connecting to the second frequency divider, for mixing the second dividing signal and the third dividing signal to generate a first mixing signal;
   a second SSB mixer connecting to the phase lock loop system and the first SSB mixer, for mixing the first mixing signal and the first dividing signal to generate a second mixing signal according to a first band selection signal; and
   a multiplexer connecting to the first SSB mixer and the second SSB mixer, for selecting the first mixing signal or the second mixing signal to output according to a second band selection signal.

2. The frequency synthesizer of claim 1, wherein the phase lock loop system comprises:
   a first output end connecting to the VCO, for outputting the voltage control signal;
   a second output end connecting to the first frequency divider and the second SSB mixer, for outputting the first dividing signal to the second SSB mixer;
   an input end connecting to the VCO and the first frequency divider, for receiving the oscillating frequency to output to the first frequency divider;
   a third frequency divider connecting to the first frequency divider, for dividing frequency of the first dividing signal to generate a feedback frequency; and
   a phase lock loop circuit connecting to the third frequency divider and the first output end, for generating the voltage control signal according to the feedback frequency and a reference frequency.

3. The frequency synthesizer of claim 2, wherein the third frequency divider divides the frequency of the first dividing signal by 8 to generate the feedback frequency of about 66 million hertz (MHz).

4. The frequency synthesizer of claim 1, wherein the first frequency divider divides the oscillating frequency by 10.

5. The frequency synthesizer of claim 1, wherein the first frequency divider comprises:
   a first frequency dividing unit for dividing the oscillating frequency by 5 to generate an inter-frequency; and
   a second frequency dividing unit for dividing the inter-frequency by 2 to generate the first dividing signal.

6. The frequency synthesizer of claim 1, wherein the second frequency divider divides the oscillating frequency by 2 to generate the second dividing signal.

7. The frequency synthesizer of claim 1, wherein the second frequency divider divides the oscillating frequency by 4 to generate the third dividing signal.

8. The frequency synthesizer of claim 1, wherein the second frequency divider comprises:
an input end connecting to the VCO, for receiving the oscillating frequency;
a first output end connecting to the first SSB mixer, for outputting the second dividing signal;
a second output end connecting to the first SSB mixer, for outputting the third dividing signal;
a first frequency dividing unit connecting to the input end and the first output end, for dividing the oscillating frequency by 2 to generate the second dividing signal; and
a second frequency dividing unit connecting to the first frequency dividing unit and the second output end, for dividing frequency of the second dividing signal by 2 to generate the third dividing signal.

9. The frequency synthesizer of claim 1, wherein the second SSB mixer adds or subtracts frequencies of the first mixing signal and the first dividing signal to generate a frequency of the second mixing signal.

10. The frequency synthesizer of claim 1, wherein the oscillating frequency is 5280 MHz.

11. The frequency synthesizer of claim 1, wherein the first dividing signal comprises a first in-phase signal and a first quadrature signal.

12. The frequency synthesizer of claim 11, wherein the first in-phase signal and the first quadrature signal both have a frequency of 528 MHz.

13. The frequency synthesizer of claim 1, wherein the second dividing signal comprises a second in-phase signal and a second quadrature signal.

14. The frequency synthesizer of claim 13, wherein the second in-phase signal and the second quadrature signal both have a frequency of 2640 MHz.

15. The frequency synthesizer of claim 1, wherein the third dividing signal comprises a third in-phase signal and a third quadrature signal.

16. The frequency synthesizer of claim 15, wherein the third in-phase signal and the third quadrature signal both have a frequency of 1320 MHz.

17. The frequency synthesizer of claim 1, wherein the first mixing signal has a frequency of 3960 MHz.

18. The frequency synthesizer of claim 1, wherein the second mixing signal has a frequency of 3432 or 4488 MHz.

19. The frequency synthesizer of claim 1, wherein the phase lock loop system divides the frequency of the first dividing signal to generate a first frequency and then compares the first frequency and an internal reference frequency to generate the voltage control signal.

* * * * *